Figure 1:
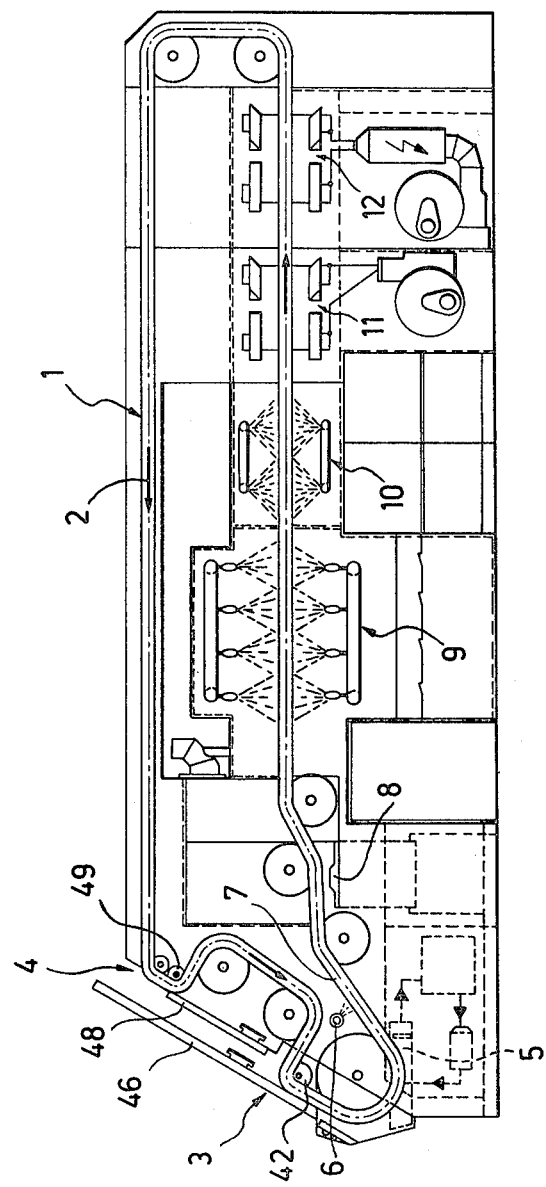

United States Patent [19]

Hoffmann

[11] 4,425,996
[45] Jan. 17, 1984

[54] APPARATUS FOR TRANSPORTING WORKPIECES THROUGH A PROCESSING SYSTEM

[75] Inventor: Johann Hoffmann, Freising, Fed. Rep. of Germany

[73] Assignee: Texas Instruments Deutschland GmbH, Freising, Fed. Rep. of Germany

[21] Appl. No.: 284,030

[22] Filed: Jul. 17, 1981

[30] Foreign Application Priority Data

Jul. 23, 1980 [DE] Fed. Rep. of Germany ....... 3027896

[51] Int. Cl.³ ............................................. B65G 47/86
[52] U.S. Cl. .................................... 198/653; 198/695
[58] Field of Search ............... 198/645, 648, 653, 654, 198/695, 696, 479, 650; 294/106, 116

[56] References Cited

U.S. PATENT DOCUMENTS

| 2,166,381 | 7/1939 | Taylor et al. | 198/696 |
|---|---|---|---|
| 2,783,962 | 3/1957 | Lyon . | |
| 3,330,400 | 7/1967 | Alexander | 198/696 |
| 3,987,888 | 10/1976 | Wickham | 198/365 |

FOREIGN PATENT DOCUMENTS

| 1556171 | 1/1970 | Fed. Rep. of Germany . |
|---|---|---|
| 2049333 | 4/1971 | Fed. Rep. of Germany . |
| 115834 | 7/1926 | Switzerland . |
| 357597 | 9/1931 | United Kingdom . |
| 363071 | 12/1931 | United Kingdom . |
| 499653 | 1/1939 | United Kingdom . |
| 569915 | 6/1945 | United Kingdom . |
| 617986 | 2/1949 | United Kingdom . |
| 629443 | 9/1949 | United Kingdom . |
| 641731 | 8/1950 | United Kingdom . |
| 650653 | 2/1951 | United Kingdom . |
| 1338876 | 11/1973 | United Kingdom . |
| 1357975 | 6/1974 | United Kingdom . |

*Primary Examiner*—Joseph E. Valenza
*Assistant Examiner*—Jonathan D. Holmes
*Attorney, Agent, or Firm*—N. Rhys Merrett; Mel Sharp; Gary Honeycutt

[57] ABSTRACT

Transportation apparatus comprising two parallel chains extending in the transport direction. Workpiece carriers are disposed between the chains and extend parallel to each other. Each workpiece carrier includes two support elements extending parallel to each other and are rigidly connected together. On each workpiece carrier, a plurality of workpiece clamps are disposed. Each workpiece clamp comprises two clamp members, respectively connected to the support elements. At least one clamp member of each workpiece clamp is pivotal about the support element with which it is connected, between a closed position and an open position. The chains are fed between a charging station, at which the workpiece clamps are changed with workpieces, and a discharge station at which the workpieces are released from the clamps.

16 Claims, 14 Drawing Figures

F I G. 5
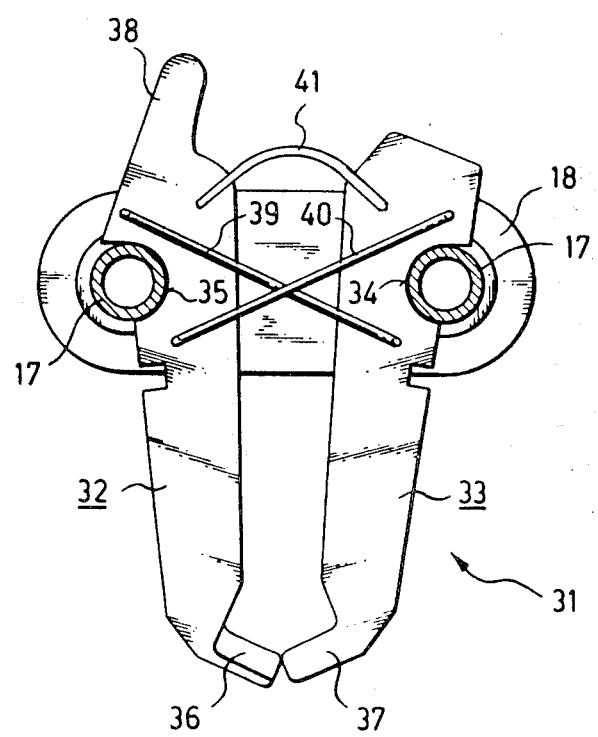

F I G. 6
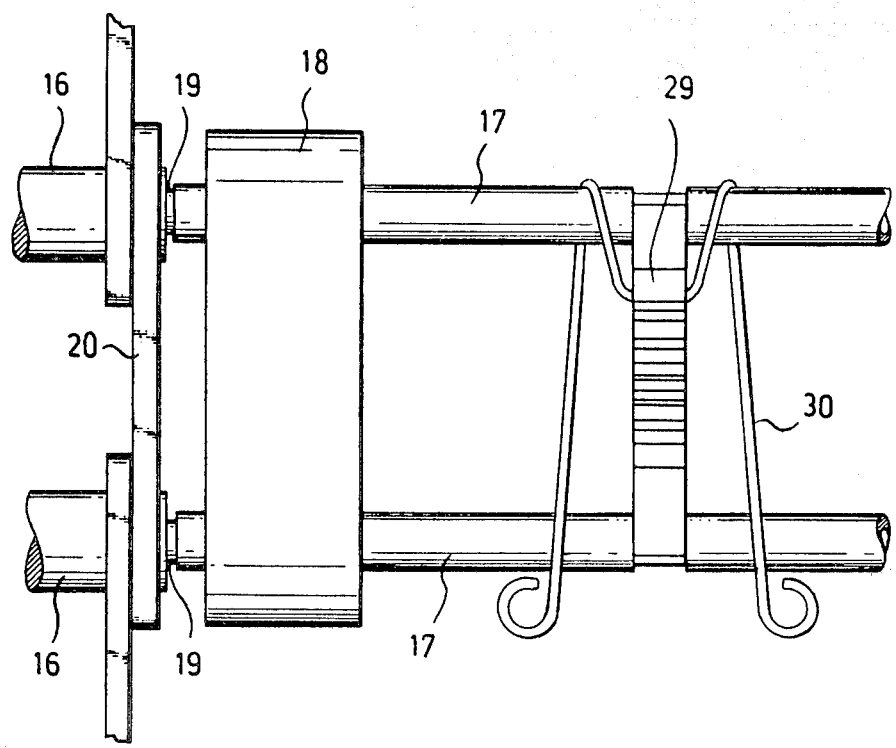

APPARATUS FOR TRANSPORTING WORKPIECES THROUGH A PROCESSING SYSTEM

The invention relates to an apparatus for transporting workpieces through a processing system.

In industrial production workpieces must frequently be transported in large numbers in processing systems consecutively through working stations in which processing steps are conducted on the workpieces. For the transport of workpieces a transport apparatus is required which guarantees a reliable transfer of workpieces from one working station to another.

The invention is based on the problem of providing an apparatus for transporting workpieces through a processing system which conveys workpieces in large numbers and reliably through working stations of a processing system.

According to the invention this problem is solved with the features set forth in the characterizing clause of claim 1. The workpiece clamps contained in the transport apparatus according to the invention guarantee reliable holding of the workpieces, and by means of the workpiece clamp holders due to their connection to the driver means the workpieces can be conducted over paths of any desired length through the processing system. Both the workpiece clamp holders and the workpiece clamps disposed thereon may be present in large numbers, enabling large numbers of workpieces to be transported.

Advantageous further developments of the invention are characterized in the subsidiary claims.

Figure 2:
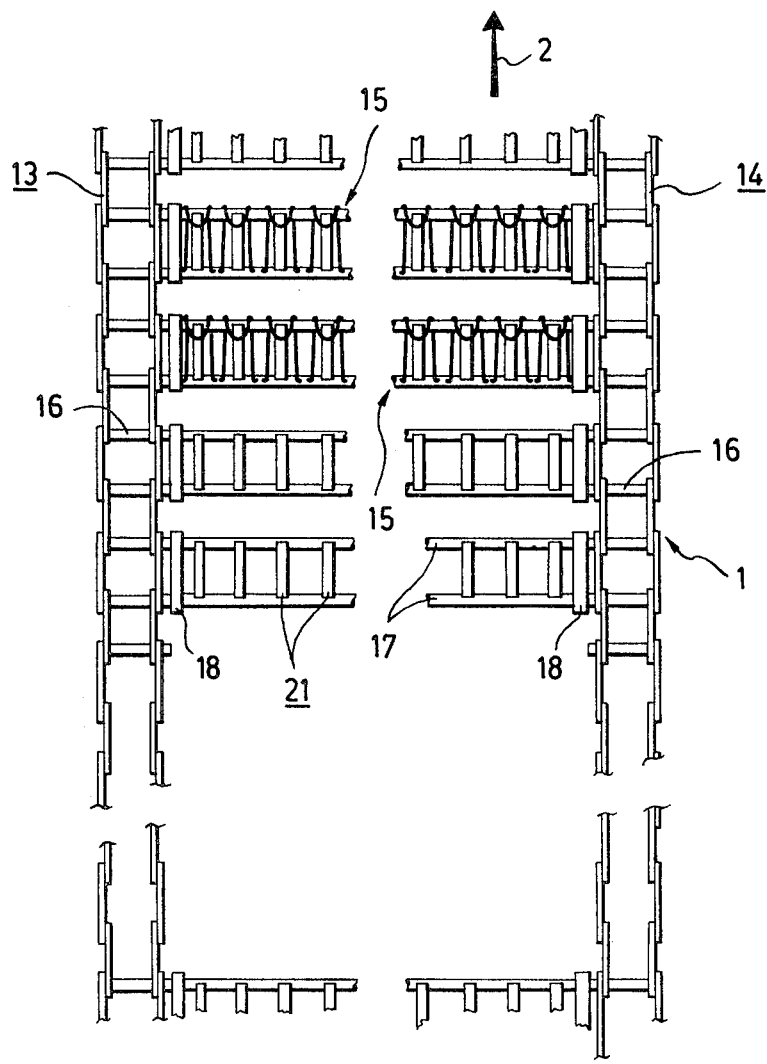
Figure 3:
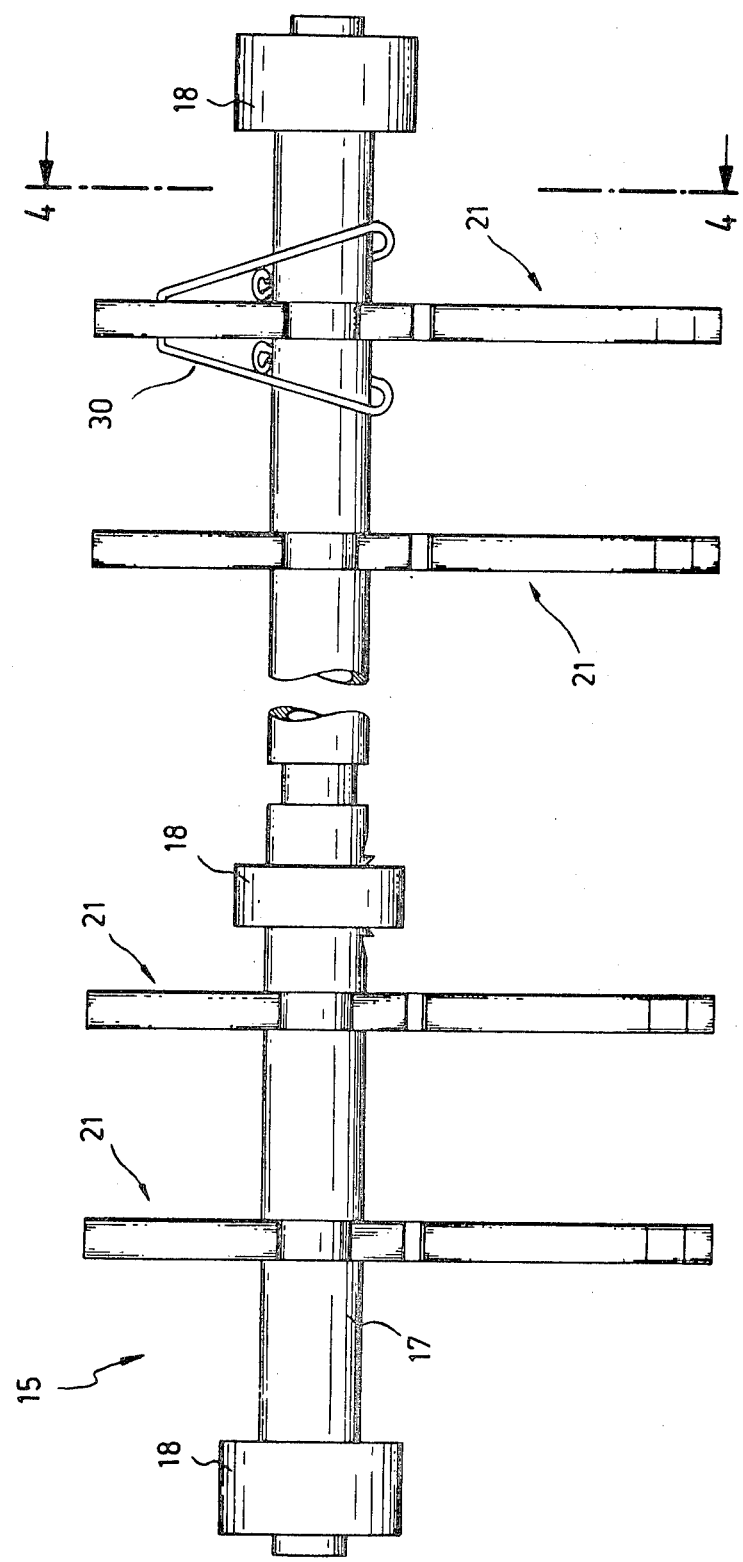
Figure 4:
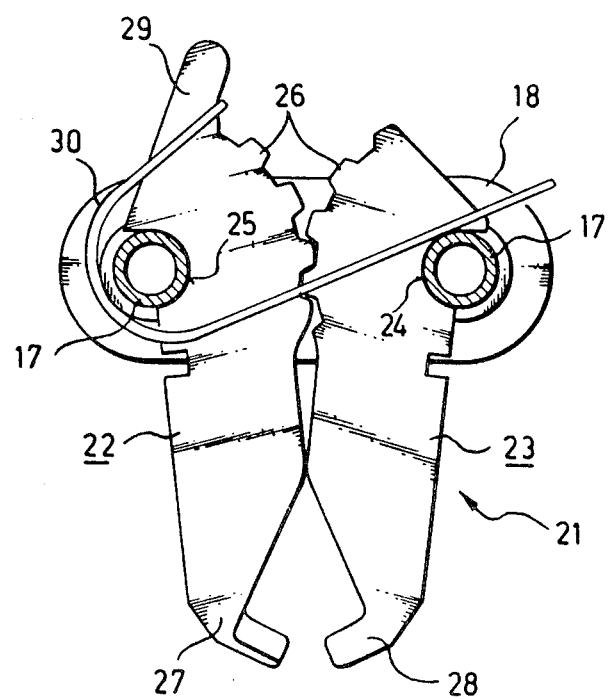
Figure 7:
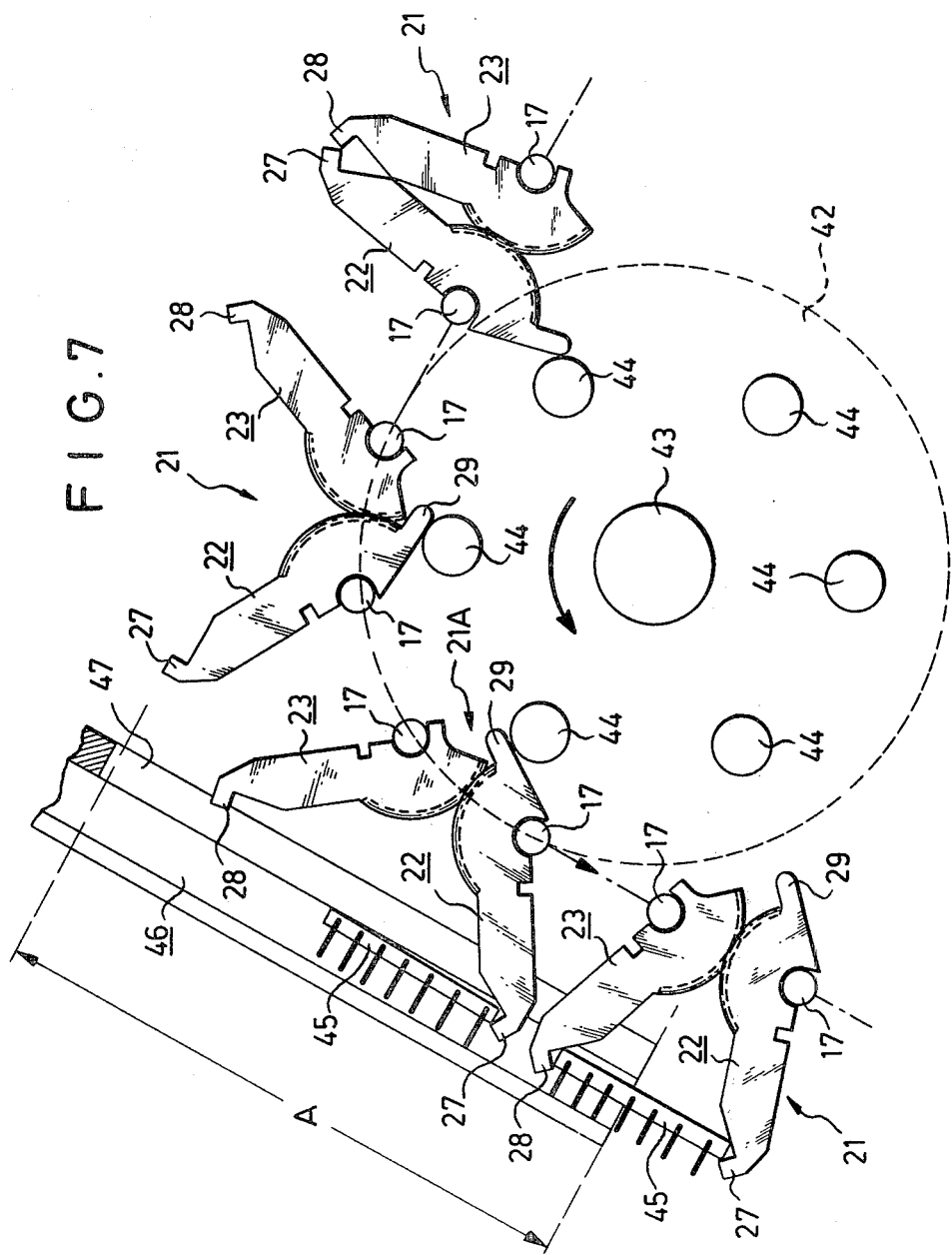
Figure 8:
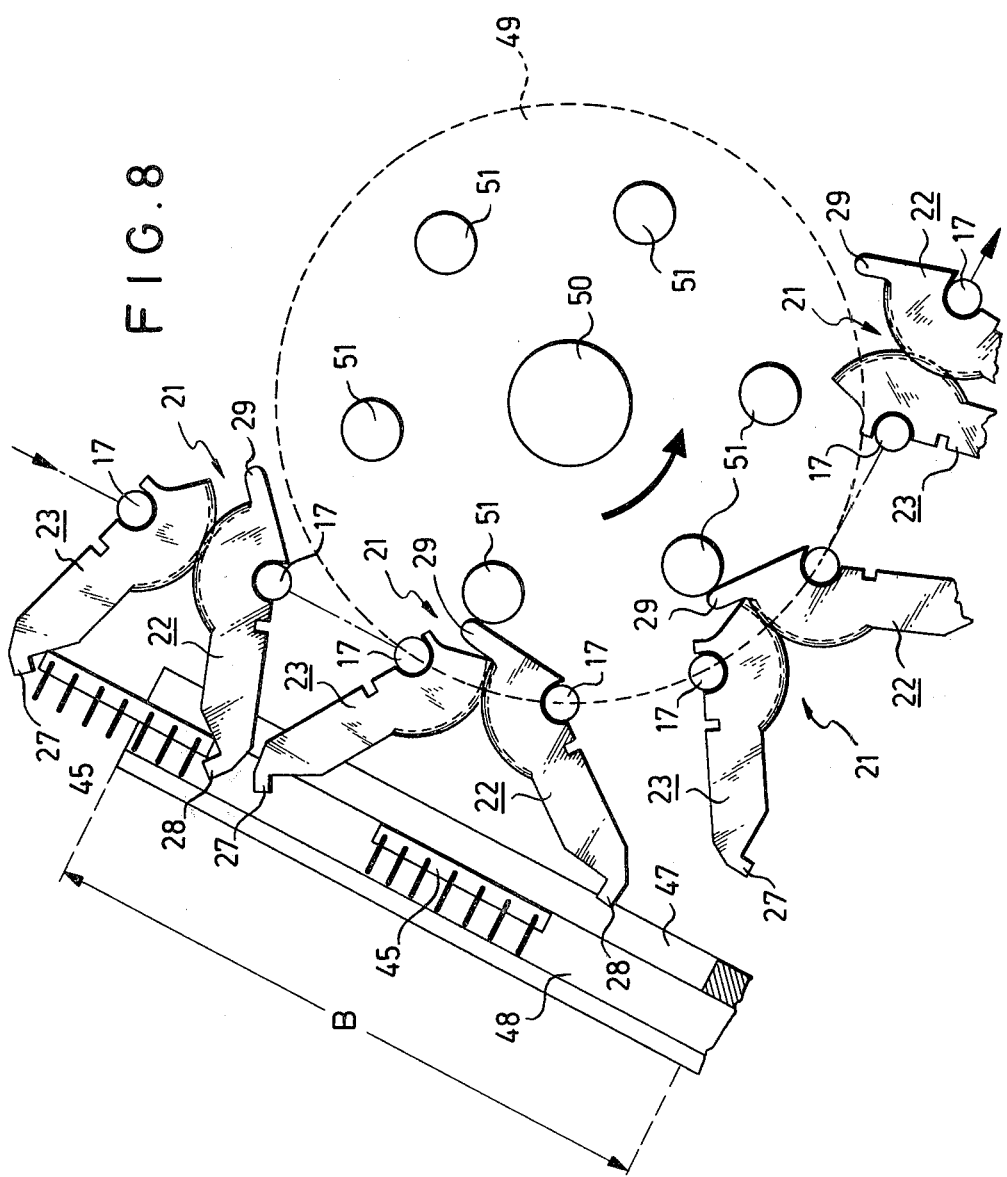
Figure 9:
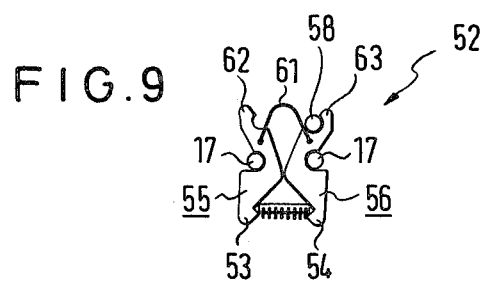
Figure 10:
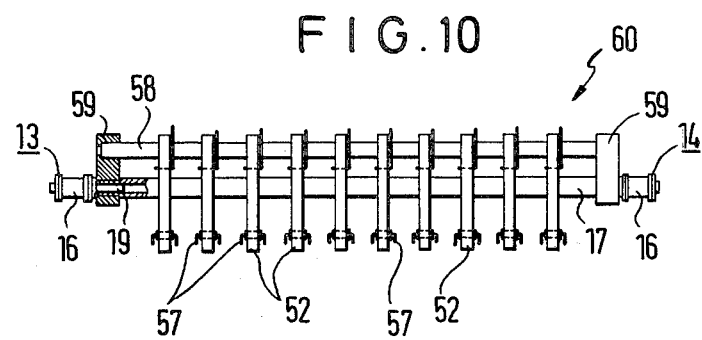
Figure 11:
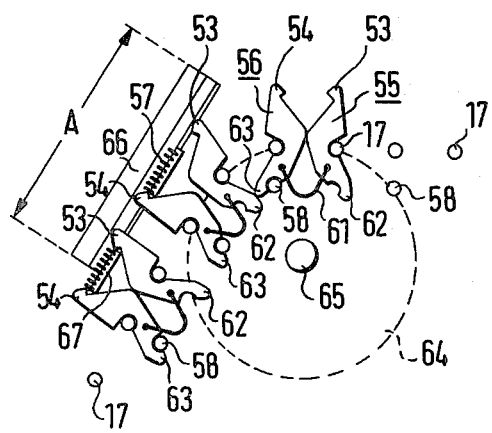
Figure 12:
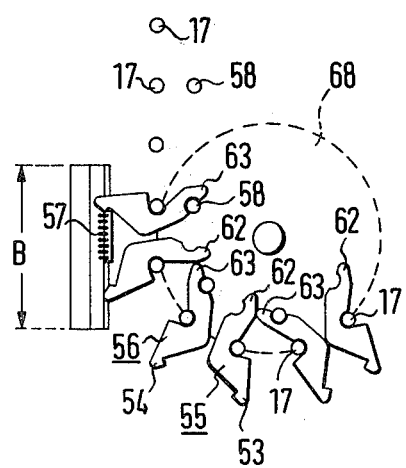
Figure 13:
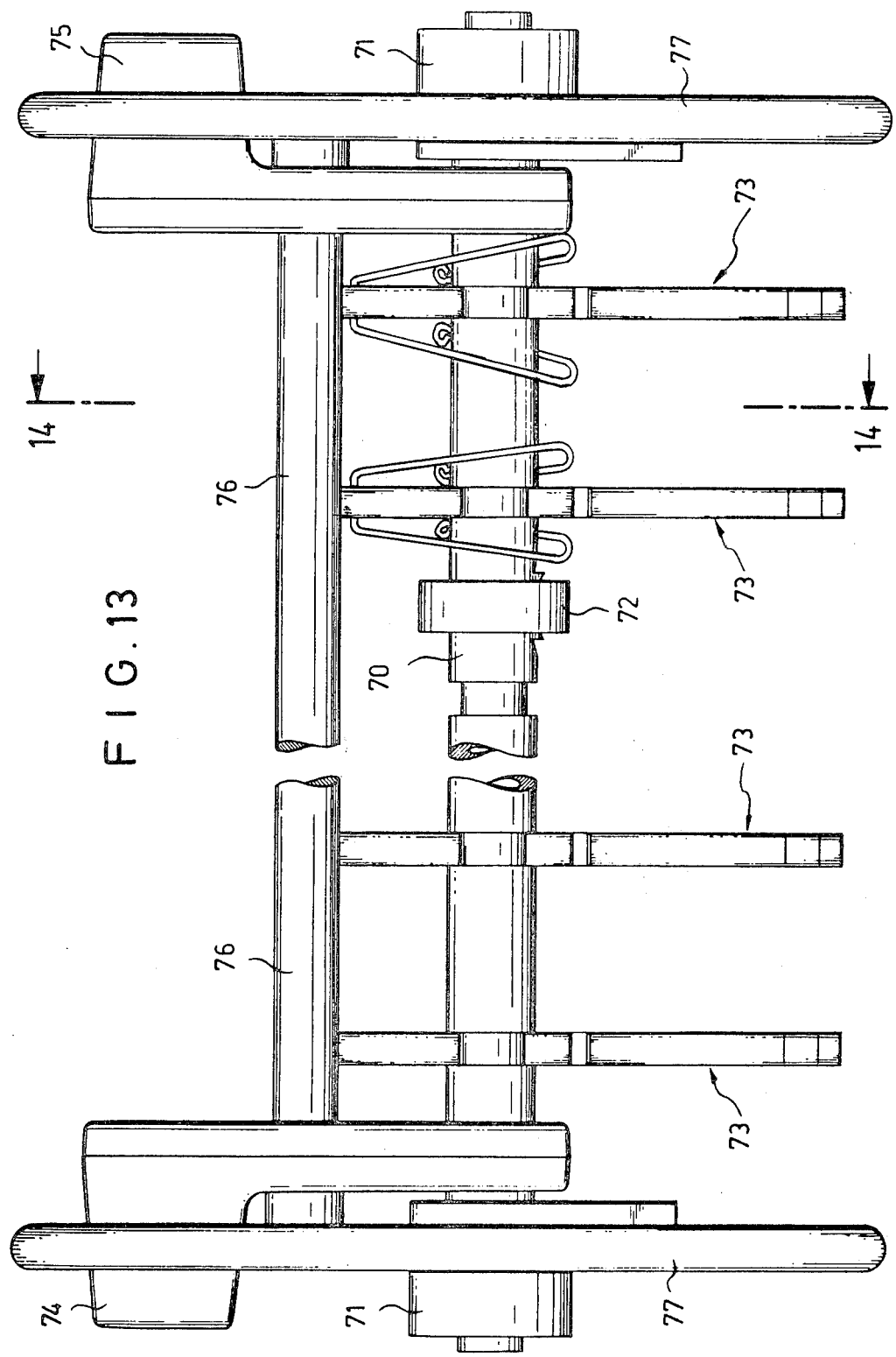
Figure 14:
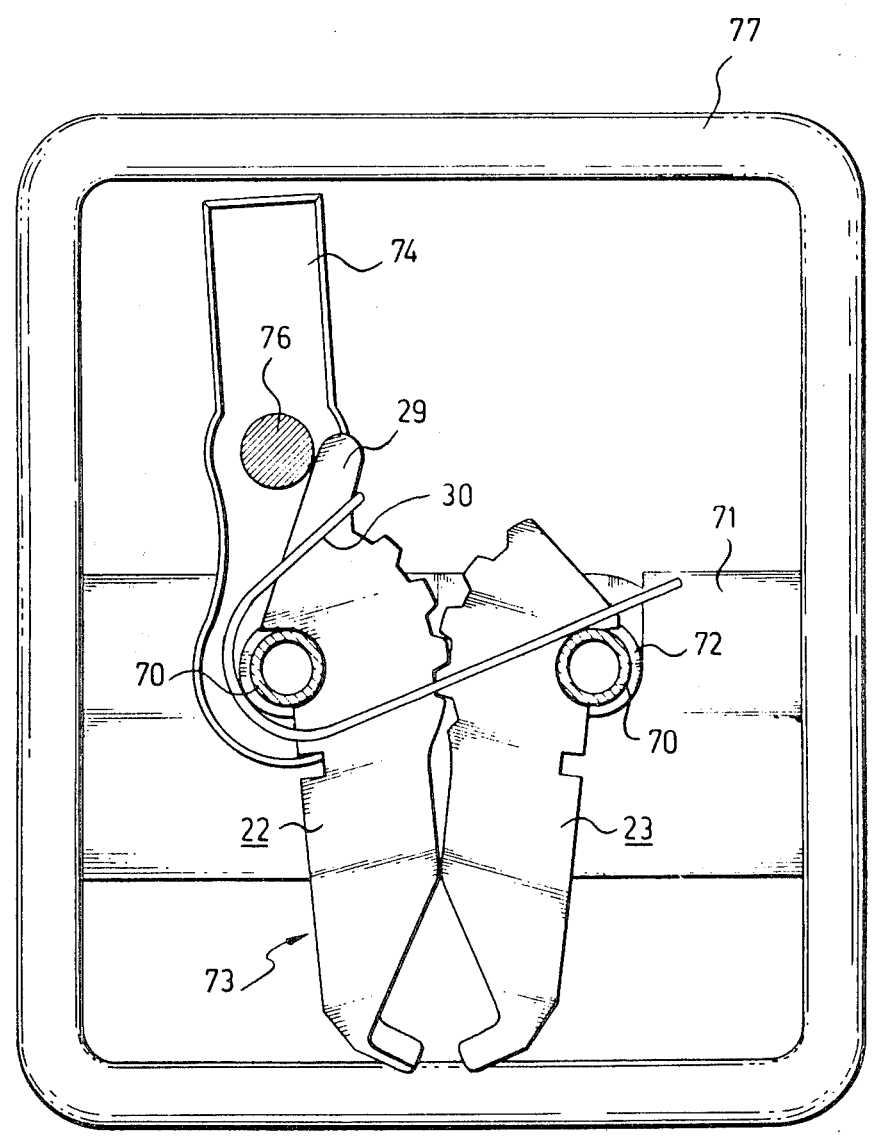

The invention will be explained by way of example with the aid of the drawings, wherein:

FIG. 1 is a schematic view of a processing system with the transport apparatus according to the invention, FIG. 2 is a plan view of a portion of the transport apparatus according to the invention, FIG. 3 is a sideview of a workpiece clamp holder, FIG. 4 is a first embodiment of a workpiece clamp in a section along the line 4—4 of FIG. 3, FIG. 5 is a second embodiment of a workpiece clamp in a similar view to FIG. 4, FIG. 6 is a plan view of a portion of a workpiece clamp holder having a workpiece clamp according to the first embodiment illustrated in FIG. 4, FIG. 7 is a schematic view of the transport apparatus at the loading or charging station for illustrating the charging operation, FIG. 8 is a schematic view of the transport apparatus at the discharging station for illustrating the discharging operation, FIG. 9 is a third embodiment of a workpiece clamp having a workpiece engaged by the clamp, FIG. 10 is a side view of a workpiece clamp holder with clamps according to the embodiment illustrated in FIG. 9, FIG. 11 is a schematic view of the transport apparatus with workpiece clamps of FIG. 9 at the charging station for explaining the charging operation, FIG. 12 is a schematic view of the transport apparatus with workpiece clamps of the embodiment of FIG. 9 at the discharging station for explaining the discharging operation, FIG. 13 is a side view of a special embodiment of an apparatus for transporting workpieces, and FIG. 14 is a section along the line 14—14 of FIG. 13.

The transport apparatus constructed according to the invention will be described in conjunction with a processing system in which the terminal pins of integrated circuits are tinned in dual-in-line housings. The transport apparatus can of course also be used in conjunction with other processing systems in which other workpieces are subjected to processing steps.

The transport means in the processing system illustrated in FIG. 1 can convey the integrated circuits to be tinned in the transport direction indicated by the arrow 2 through the entire system. The integrated circuits are picked up by the transport apparatus 1 at a charging or loading station 3, conveyed through the entire system and finally released again at a discharging station 4. The exact charging and discharging will be explained in detail hereinafter.

On their path through the processing system the integrated circuits engaged by the transport apparatus 1 after the charging station 3 first come to a flux bath 5 in which their terminal pins are coated with a flux to prepare for the actual tinning operation. By blowing air from a nozzle 6 excess flux is removed from the integrated circuits. After preheating in a heating zone 7 the integrated circuits are transported through a flow soldering bath 8 in which the terminal or connection pins are coated with a tin layer. Thereafter the integrated circuits are cleaned from solder residues in a washing station 9, rinsed in a rinsing station 10 and finally subjected to cold and hot air in two blowing stations 11 and 12. The integrated circuits, now tinned, cleaned and dried, are then further conveyed to the discharging station 8 where they are released from the transport apparatus and can be removed from the processing system.

The illustration of FIG. 2 shows exactly the construction of the transport apparatus 1. As shown by FIG. 2, the transport apparatus 1 comprises a driver means in the form of two parallel spaced pin chains 13 and 14. Between these pin chains 13 and 14 workpiece clamp holders 15 extend and run parallel to each other perpendicularly to the transport direction indicated by the arrow 2.

Each workpiece clamp holder 15 comprises two support rods 17 which extend parallel to each other with the same spacing as the pins of the pin chain and which are rigidly connected together with the aid of connecting members 18. In FIG. 2 such connecting members 18 are shown only at the respective ends of the support rods 17 but said support rods 17 may also be connected together at one or more intermediate points with the aid of such connecting members if this is necessary because of greater length of the support rods.

The support rods 17 are hollow spindles whose ends are fitted onto portions 19 of the pins 16 of the chains 13 and 14 which project at the two facing sides at the link plates 19. FIG. 6 shows more clearly the connection between two support rods 17 and the portions 19 projecting at the link plates.

A plurality of workpiece clamps 21 are arranged adjacent each other at each workpiece clamp holder 15. FIG. 3 shows a workpiece clamp holder 15 comprising a plurality of adjacent workpiece clamps 21 disposed thereon. In the workpiece clamp holder 15 illustrated in FIG. 3 the support rods 17 are rigidly connected not only at their ends but also therebetween with the aid of connecting members 18 so that the rigid connection is guaranteed even with greater lengths of the carrier rods.

The structure of the workpiece clamps 21 is apparent from FIG. 4 which shows a section along the line 4—4 of FIG. 3. A workpiece clamp 21 comprises two clamp members 22 and 23 which are each pivotally connected to their associated support rod 17. For connection to each support rod 17 each clamp member 22, 23 comprises an arcuate recess 24, 25 which engages round the support rod at an angle of at the most 180°. FIGS. 3 and 4 show that the support rods 17 comprise at the point at which they are engaged by the arcuate recesses 24, 25 of the clamp members 22, 23 a reduced diameter. The length of the portion with reduced diameter corresponds to the thickness of the clamp members 22, 23. As a result, the clamp members 22, 23 cannot shift in the longitudinal direction along the support rods 17 when the arcuate recesses 24, 25 engage the support rods 17.

The limitation of the engagement angle of the recesses 24, 25 round the support rods 17 to an angle of at the most 180° permits simple attachment of clamp members to the support rods 17 and a simple replacement of broken or damaged clamp members.

In the example of embodiment of FIG. 4 the clamp members 22, 23 are connected by engagement of tooth segments 26 which are disposed on the clamp members 22, 23. These tooth segments lie on arcs round the axes of the support rods 17.

Each clamp member 22, 23 of the workpiece clamps 15 comprises a grip portion 27, 28 which projects in one direction at the face formed by the pin chains and support rods. The clamp member 22 is provided at its end opposite the grip portion 27 with an actuating portion 29 which projects in the direction remote from the grip portions 27, 28 from the face formed by the pin chains 13, 14 and the support rods 17.

The clamp members 22, 23 are held in the closure position positively with the aid of a spring 30. The spring 30 engages the actuating portion 29 at the clamp member 22, wraps round the support rod 17 on the left in FIG. 4 and is supported on the support rod 17 on the right. This path of the spring 30 is also clearly apparent from the illustration of FIG. 3. The spring 30 always tends to pivot the clamp member 22 in the view of FIG. 4 anticlockwise, and during a pivoting the clamp member 23 is pivoted in the opposite direction, i.e. clockwise, due to the engagement of the tooth segments 26.

FIG. 5 shows a further embodiment of a workpiece clamp 31 in a similar view to FIG. 4. As regards the clamp members 32, 33, the recesses 34, 35, the grip portions 36, 37 and the actuating portion 38, the workpiece clamp 31 is basically the same as the workpiece clamp 21 of FIG. 4. The difference between the two embodiments resides in that the clamp members 32, 33 of the workpiece clamp 31 are not connected with the aid of tooth segments but with the aid of a linkage connection comprising two rods 39 and 40. The two rods are arranged so that each connects a point on one clamp member lying above the plane formed by the pivot axes of the clamp members 32, 33 to a point on the other clamp member lying beneath said plane. The spring 41 connected to both clamp members 32, 33 holds the clamp members positively in the closure position.

The workpiece clamps 21, 31 illustrated in FIGS. 4 and 5 may be opened by exerting a force on the actuating portion 29, 38 which pivots the respective clamp member 22, 32 in the clockwise direction. Because of the connection of the clamp members the other clamp member 23 or 33 respectively is pivoted into the open position. It should be observed that on pivoting of the clamp member provided with the respective actuating portion through an angle α a relative pivoting of the two clamp members with respect to each other through an angle 2α takes place. This permits, even with a relatively small pivot angle at the actuating portion, a relatively wide expansion of the grip portions at the clamp members so that even large workpieces, for example integrated circuits with 40 connection or terminating pins, can be reliably gripped.

It will now be explained with the aid of FIGS. 7 and 8 how the workpiece clamps of the transport apparatus grip workpieces constituted by integrated circuits at a charging or loading station (FIG. 7) and release said workpieces again at a discharging station when the desired processing operations have been carried out (FIG. 8).

At the charging station illustrated diagramatically in FIG. 7 the pin chains 13, 14 of the transport apparatus 1 run round sprockets 42 which are shown diagramatically only as dashed circles. The sprockets 42 are connected non-rotatably to a sprocket shaft 43 with the same spacing as the pin chains 13, 14. In addition, the sprockets are connected by means of transverse rods 44 which are disposed parallel to the sprocket shaft 43 on a circle about the sprocket axis. The angular interval of the transverse rods 44 in the peripheral direction is equal to the angular interval of the workpiece clamps 21 following each other in the transport direction when the workpiece clamp holders 15 are led round the sprockets 42. As apparent from FIG. 7 the length of the actuating portions 29 at the clamp members 22 of each workpiece clamp 21, the position and the diameter of the transverse rods 44 in the peripheral direction relatively to the position of the workpiece clamp holders 15 and the radius of the circle on which the transverse rods 44 are disposed are adapted to each other so that the transverse rods 44 when the workpiece clamp holders 15 are led round the sprockets 42 meet the actuating portions 29 of the pivotal clamp members 22 and pivot the latter out of the closure position into the open position. When the pin chains 13, 14 come into engagement tangentially with the sprockets 42 the actuating portions 29 also approach the transverse rods 44 so that the clamp member 22 provided with the actuating portion 29 in the illustration of FIG. 7 pivots anticlockwise about its support rod 17. Because of the tooth segment connection between the two clamp members of each workpiece clamp 15 the other clamp member 23 is pivoted clockwise, leading to opening of the workpiece clamp 21. On further movement of the pin chains 13, 14 the grip portion 27, 28 of the open workpiece clamps 21 now enter a charging station A in which they can each be loaded with an integrated circuit 45. The charging section A is disposed relatively to the sprockets 42 so that the pin chains 13, 14 become detached from the sprockets 42 again whilst the workpiece clamps 21 are still within the charging section A. Since the engagement between the transverse rods 44 and the actuating portions 29 is released when the pin chains 13, 14 are detached from the sprockets 42, the workpiece clamps 21 close again when they are still within the charging section A. In this manner an integrated circuit 45 introduced between the grip portions 27, 28 of an opened workpiece clamp 21 is engaged by said portions 27, 28 and entrained by the closed workpiece clamp 21 on its path through the processing system.

As feed means for the integrated circuits 45 chutes 46 are used which are disposed parallel with the lateral spacing of the workpiece clamps 21 at a workpiece clamp holder 15. The chutes 46 lie tangential to a circuit about the sprocket axis 43 whose radius is smaller than the radius of the arc on which the grip portions 27, 28 of the workpiece clamps 21 move round the sprocket axis 43.

At the lower sides of the chutes 46 slots 47 are formed into which the grip portions 27, 28 of the workpiece clamps 21 can enter on their path round the sprockets 42.

When the transport apparatus 1 is in operation whenever the workpiece clamps 21 on a workpiece clamp holder 15 assume the position of the workpiece clamp 21a of FIG. 7 integrated circuits 45 are introduced into the chutes 46 so that they bear on the leading grip portion 27, seen in the transport direction, and on closure of the workpiece clamps can also be engaged by the other grip portion 28.

Unloading of the workpiece clamps 21 at a receiving means for receiving the integrated circuits 45 released by the workpiece clamps 21 is also by means of chutes 48 which correspond substantially to the chutes 46 of FIG. 7 but assume a different relative position at the discharging station with respect to the pin chains 13, 14. At the charging station the pin chains approach the chutes 46 perpendicularly whilst at the discharging station they approach the chutes 48 in the longitudinal direction thereof.

The sprockets 49 at the discharging station are nonrotatably mounted on a sprocket shaft 50. Transverse rods 51 extend like the transverse rods 44 at the sprockets 42 of the charging station between the sprockets 49 of the discharging station. Said transvese rods 51 are intended to open the workpiece clamps 21 by action on the actuating portions 29 when they are within a discharging section B in the discharging station.

The chutes 48 in the discharging station are also disposed tangential to a circle round the sprocket axis 50 whose radius is smaller than the radius of the arc on which the grip portions 27, 18 of the workpiece clamps 21 move round the sprocket axis 50. The lower sides of the chutes 48 are provided with slots 51 into which the grip portions 27, 28 can enter on their path round the sprocket axis 50.

As apparent from FIG. 8, the workpiece clamps 21 approach the chutes 48 in the closed condition and enter the discharging section B in this closed condition. Now, when the pin chains 13, 14 come into engagement with the sprockets 49 the transverse rods 51, due to action on the actuating portions 29 at the clamp members 22 of the workpiece clamps 21, effect the opening of the clamps within the discharging section B so that the integrated circuits 45 are released and received by the chutes 48.

By varying the radius of the circle on which the transverse rods 44 and 51 are disposed round the sprocket axes 43, 50, or by varying the diameter of the individual transverse rods 44, 51, the expansion angle between the clamp members 22, 23 of the workpiece clamps 21 can be changed. In this manner a simple adaptation of the expansion angle of the workpiece clamps 21 to the size of the workpieces to be gripped is possible.

The same functional cycles are obtained if instead of the workpiece clamps 21 of FIG. 4 illustrated in FIGS. 7 and 8 the workpiece clamps 31 of FIG. 5 are used.

In FIG. 9 a further embodiment of a workpiece clamp 52 is shown. FIG. 9 shows the workpiece clamp 52 with an integrated circuit 57 engaged by the grip portions 53, 54 of its clamp members 55, 56. With this workpiece clamp 52 only the clamp member 55 can be pivoted about the associated support rod 17, the other clamp member 56 being mounted nonrotatably. The securing of the clamp member 56 is with the aid of a third support rod 58 which is fixedly connected to connecting members 59 which also hold the support rods 17 together. A complete workpiece clamp holder 60 with the support rods 17, the additional support rod 58 and the connecting members 59 is illustrated in FIG. 10. The support rods 17, as in the examples of embodiment previously described, are fitted onto projecting portions 19 on the pins 16 of the chains 13 and 14.

Between the two clamp members 55 and 56 of the workpiece clamp 52 a spring 61 is disposed which holds the clamp member 55 positively in the closure position.

The workpiece clamps 52 are disposed in the transport means so that the clamp member 55 pivotal about the support rod 17 is rearward in the transport direction. The pivotal clamp member 55 comprises at its end opposite the grip portion 53 an actuating portion 62 whilst the non-pivotal clamp member 56 is provided at its end opposite the grip portion 54 with a stop nose 63. Said stop nose 63 plays a part in the automatic opening of the workpiece clamps 52 at the charging station and at the discharging station.

FIGS. 11 and 12 show how the workpiece clamps 52 automatically open at the charging station (FIG. 11) and the discharging station (FIG. 12). At the charging station the pin chains 13, 14 of the transport apparatus 1 are led round conventional sprockets 64 fixed non-rotatably with a sprocket shaft 65. The distance between two workpiece clamps 52 arranged in successive workpiece clamp holders 60 and the radius of the sprockets 64 at the charging station are adapted to each other so that when the pin chains 13, 14 are led round the sprockets 64 the stop nose 63 on the non-rotatable clamp member 56 of the workpiece clamps 52 lying behind the transport direction meets the actuating portion 65 of the workpiece clamps 52 in front in the transport direction and pivots the clamp member 55 into the open position. The workpiece clamps 52 thus pass through in the charging station a charging section A into which they enter in the open condition and within which they close. At this charging section A chutes 66 are provided in the same manner as was described in conjunction with the example of embodiment of FIG. 7. By means of said chutes 66 integrated circuits 57 can be supplied to the open workpiece clamps 52 at the charging section A. After leaving the charging section A the integrated circuits 57 are entrained by the closed workpiece clamps 52 through the processing system.

In the discharging station illustrated in FIG. 12 the workpiece clamps 52, as in the charging station of FIG. 11, are opened by the stop noses 63 of the workpiece clamps 52 trailing in the transport direction coming against the actuating portions 62 of the workpiece clamps 52 leading in the transport direction when the clamps move round the sprockets 68 at the discharging station. This again gives a discharging section B into which the workpiece clamps 52 enter in the closed condition and in which they open to release the integrated circuits 67. As in the example of embodiment of FIG. 9, chutes 69 are associated with the discharging section as receiving means for the integrated circuits 57 released by the opening workpiece clamps 52.

The relative position of the chutes 66 at the charging station and of the chutes 69 at the discharging station with respect to the pin chains corresponds substantially to the relative position of the chutes 46 and 48 and consequently it would be superfluous to define the position relationships again.

A workpiece clamp holder with workpiece clamps of the type described can also be used in a manual appliance for transporting workpieces. Such a manual appliance is illustrated in FIGS. 13 and 14. The manual appliance contains two support rods 70 which are rigidly connected together with the aid of a connecting member 71. To obtain as rigid a connection as possible of the support rod 70 a further connecting member 72 may be disposed between the connecting members 71. The support rods 70 with their connecting members 71 and 72 and the workpiece clamps 73 disposed thereon form practically a workpiece clamp holder as illustrated in FIG. 3.

Two push members 74 and 75 are rotatably connected to the support rod 70 which carries the clamp members 22 provided with the actuating portion 29. The connection point between the push members and the associated support rod 70 is disposed near the connecting members 72. The push members 74, 75 are connected by a transverse rod 76 so that they pivot jointly with said rod 76 round the support rod 70 when an actuating force is exerted on them.

The transverse rod 76 moves when the push members 74, 75 are pivoted on an arc about the support rod 70 whose radius is smaller than the radial extent of the actuating portion 29 of the clamp member 22 from its pivot axis so that it strikes against the actuating portions 29 of the workpiece clamps 73. On further pivoting, the workpiece clamps can thereby be moved out of the closure position in which they are held positively by the spring 30 into the open position.

Disposed at the ends of the workpiece clamp holder is a holding frame 77. Said holding frames 77 define a substantially square area and are so dimensioned that the workpiece clamps 73 disposed therebetween lie completely within the space defined thereby. This has the advantage that the workpiece clamp holder can be laid down in any position without the workpiece clamps 73 coming into contact with the supporting surface.

I claim:

1. Apparatus for transporting workpieces in a transport direction through a processing system, said apparatus comprising two pairs of spaced rotatable sprockets; two parallel chains each engaging with a sprocket of each pair and extending in the transport direction through said processing system, a plurality of workpiece carriers disposed between said chains and extending parallel to each other transversely to the transport direction, each workpiece carrier including two fixedly interconnected support elements which extend parallel to each other between the chains, a plurality of workpiece clamps disposed on each workpiece carrier and each comprising two clamp members, one clamp member connected to one of said two support elements and the other clamp member connected to the other support element of said workpiece carrier, and means pivotally mounting at least one clamp member of each workpiece clamp about the support element with which it is connected for pivoting between a closure position and an open position, at least one pair of said two pairs of sprockets connected by transverse rods disposed parallel to the sprocket axis of rotation and on a circle about said axis of rotation for engagement with said at least one clamp member of the respective workpiece clamps during rotation of said at least one pair of sprockets to effect said pivoting between a closure position and an open position.

2. Apparatus according to claim 1, wherein each chain comprises parallel spaced pins extending transversely of the transport direction, said pins interconnected by pairs of spaced link plates, each pin having a projection, and wherein the ends of the support elements are connected to the pin projections.

3. Apparatus according to claim 2, wherein the support elements of the workpiece carriers are support rods comprising hollow spindles whose ends receive the pin projections.

4. Apparatus according to claim 3, wherein each clamp member comprises at one end a grip portion which projects in one direction at the face formed by the pin chains and the support rods.

5. Apparatus according to claim 4, including means spring biasing the clamp members in the closure position.

6. Apparatus according to claim 4, wherein said sprocket means engage with the pin chains from the side of the face formed by the pin chains and the support elements remote from the grip portions of the workpiece clamps.

7. Apparatus according to claim 6, wherein both clamp members of each workpiece clamp are pivotal about their support element and the clamp members of each workpiece clamp are connected together so that on pivoting of the said at least one clamp member about its support rod out of the closure position into the release position and conversely, the other clamp member is pivoted in the same manner.

8. Apparatus according to claim 7, wherein the clamp members are connected together by means of toothed segments.

9. Apparatus according to claim 7, wherein both clamp members comprise for connection to their associated support element an arcuate recess which encloses the support element in an angle of at the most 180.

10. Apparatus according to claim 6, wherein the workpiece clamps enter into a charging section at the charging station in an opened condition and close within the charging section, and the workpiece clamps enter into a discharging section in the discharging station in the closed condition and open within the discharging section.

11. Apparatus according to claim 10, wherein the charging section has associated therewith a feed means for feeding workpieces to the opened workpiece clamps and the discharging section has associated therewith a receiving means for receiving workpieces freed by the opening workpiece clamps.

12. Apparatus according to claim 11, wherein the feed means and the receiving means are formed by a plurality of chutes which extend parallel with the spacing of the workpiece clamps and are disposed tangentially to a circle round the sprocket rotational axis at the charging station and discharging station, the radius of said circle being smaller than the radius of the arc on which the grip portions of the workpiece clamps move round the sprocket rotational axes, and the bottom surfaces of the chutes having slots into which the grip portions of the workpiece clamps enter on their movement round the sprocket rotational axes.

13. Apparatus for transporting workpieces in a transport direction through a processing system, said apparatus comprising two parallel chains extending in the transport direction through said processing system, two spaced pairs of sprocket means for feeding the chains in the processing system between a charging station for charging the workpiece clamps with the workpieces and a discharging station for releasing the workpieces from the workpiece clamps, a plurality of workpiece carriers disposed between said chains and extending parallel to each other transversely to the transport direction, each workpiece carrier including two support elements which extend parallel to each other between the chains, a plurality of workpiece clamps disposed on each workpiece carrier, each clamp comprising two clamp members, each clamp member having one end projecting in one direction from a plane containing the clamps and the support elements, each said one end comprising a grip portion, one clamp member being connected to one of said two support elements and the other clamp member connected to the other support element of said workpiece carrier, means pivotally mounting at least one clamp member of each workpiece clamp about the support element with which it is connected for pivoting between a closure position and an open position said sprockets engaging the chains from the side of the face formed by the chains and the support elements remote from the grip portions of the workpiece clamps, wherein said two pairs of said sprocket means are located respectively adjacent said charging station and said discharging station, each pair of said sprocket means connected by transverse rods disposed parallel to the axis of rotation of that pair of sprocket means and on a circle about said axis of rotation for engagement with said at least one clamp members of said workpiece clamps during rotation of said sprocket means to effect said pivoting between a closure position and an open position.

14. Apparatus according to claim 13, including means for holding the clamp members positively in the closure position.

15. Apparatus according to claim 14, wherein the said at least one clamping members of the workpiece clamps are engaged by the transverse rods of the pair of sprocket means adjacent the charging station to pivot the workpiece clamps into said open position as they enter the charging station and are disengaged by those transverse rods so that the workpiece clamps pivot towards said closure position within the charging station, and wherein the said workpiece clamps enter into the discharging station in the closure position and the said at least one clamping members of the workpieces are engaged by the transverse rods of the pair of sprocket means adjacent the discharging station to pivot the workpiece clamps into said open position within the discharge station.

16. Apparatus according to claim 15, wherein the charging station has associated therewith a feed means for feeding workpieces to the opened workpiece clamps and the discharging station has associated therewith a receiving means for receiving the workpieces freed by the opening workpiece clamps.

* * * * *